United States Patent
Hooper et al.

(10) Patent No.: US 9,021,689 B2
(45) Date of Patent: *May 5, 2015

(54) METHOD OF MAKING A DUAL PORT PRESSURE SENSOR

(75) Inventors: Stephen R. Hooper, Mesa, AZ (US); William G. McDonald, Payson, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1007 days.

This patent is subject to a terminal disclaimer.

(21) Appl. No.: 13/151,409

(22) Filed: Jun. 2, 2011

(65) Prior Publication Data

US 2012/0304452 A1    Dec. 6, 2012

(51) Int. Cl.
*H01C 17/02*       (2006.01)
*G01L 13/02*       (2006.01)
*H01L 23/31*       (2006.01)
(Continued)

(52) U.S. Cl.
CPC .............. *G01L 13/025* (2013.01); *H01L 29/84* (2013.01); *H01L 23/315* (2013.01); *H01L 2224/48137* (2013.01); *H01L 2224/48247* (2013.01);
(Continued)

(58) Field of Classification Search
CPC ....................................................... H01C 17/02
USPC ..................... 29/621.1, 832, 831, 841, 25.41; 73/700–756
See application file for complete search history.

(56) References Cited

U.S. PATENT DOCUMENTS

| | | |
|---|---|---|
| 4,879,903 A | 11/1989 | Ramsey et al. |
| 5,257,547 A | 11/1993 | Boyer |

(Continued)

FOREIGN PATENT DOCUMENTS

| | | |
|---|---|---|
| DE | 102007029356 A1 | 1/2008 |
| EP | 1785708 A2 | 5/2007 |

OTHER PUBLICATIONS

U.S. Appl. No. 13/151,404, Hooper, Stephen R., "Dual Port Pressure Sensor", filed Jun. 2, 2011, Office Action—Notice of Allowance, mailed Jul. 5, 2012.

(Continued)

*Primary Examiner* — Peter DungBa Vo
*Assistant Examiner* — Kaying Kue

(57) ABSTRACT

A method of forming a dual port pressure sensor includes forming a first opening and a second opening in a flag of a lead frame. An encapsulant is molded to hold the lead frame in which the encapsulant is over a top of the flag and a bottom of the flag is uncovered by the encapsulant. A first opening in the encapsulant is aligned with and larger than the first opening in the flag and a second opening in the encapsulant aligned with the second opening in the flag. A pressure sensor transducer is attached to the bottom of the flag to cover the first opening in the flag, wherein the pressure sensor transducer provides an electrically detectable correlation to a pressure differential based on a first pressure received on its top side and a second pressure received on its bottom side. An integrated circuit is attached to the bottom of the flag. The integrated circuit is electrically coupled to the pressure sensor. A lid is attached to the encapsulant to form an enclosure around the bottom of the flag. The pressure sensor transducer receives the first pressure through the first opening in the encapsulant and the first opening in the flag and the second pressure through the second opening in the encapsulant, the second opening in the flag, and the enclosure.

20 Claims, 4 Drawing Sheets

(51) Int. Cl.
  *G01L 19/00*     (2006.01)
  *G01L 19/14*     (2006.01)
  *H01L 29/84*     (2006.01)

(52) U.S. Cl.
  CPC ... *H01L2224/49171* (2013.01); *G01L 19/0038* (2013.01); *G01L 19/141* (2013.01)

(56) References Cited

U.S. PATENT DOCUMENTS

| | | |
|---|---|---|
| 5,672,808 A | 9/1997 | Klauder et al. |
| 5,691,480 A | 11/1997 | Cook, Sr. et al. |
| 5,834,638 A | 11/1998 | Taylor et al. |
| 5,969,259 A | 10/1999 | Cook, Sr. et al. |
| 5,969,591 A | 10/1999 | Fung |
| 6,148,673 A | 11/2000 | Brown |
| 6,150,681 A | 11/2000 | Allen |
| 7,162,927 B1 | 1/2007 | Selvan et al. |
| 7,497,124 B2 | 3/2009 | Kuznia et al. |
| 7,793,550 B2 * | 9/2010 | Elian et al. ............ 73/754 |
| 7,798,008 B2 * | 9/2010 | Stuermann et al. ........ 73/754 |
| 7,832,278 B2 * | 11/2010 | Sham et al. ............ 73/754 |
| 8,171,800 B1 | 5/2012 | Chiou |
| 8,245,575 B2 * | 8/2012 | Chiou et al. ............ 73/431 |
| 8,307,714 B1 * | 11/2012 | Hooper et al. ............ 73/756 |
| 8,353,214 B2 * | 1/2013 | Adam et al. ............ 73/706 |
| 8,359,927 B2 * | 1/2013 | Hooper et al. ............ 73/721 |
| 2009/0288484 A1 | 11/2009 | Selvan |
| 2011/0232389 A1 | 9/2011 | Chiou et al. |
| 2012/0144923 A1 | 6/2012 | Yahata |

OTHER PUBLICATIONS

EP Application No. 12169620, Extended Search Report, Nov. 22, 2012.

\* cited by examiner

METHOD OF MAKING A DUAL PORT PRESSURE SENSOR

CROSS-REFERENCE TO RELATED APPLICATION(S)

This application is related to U.S. patent application Ser. No. 13/151,404, filed on even date, titled "DUAL PORT PRESSURE SENSOR," naming Stephen R. Hooper and William G. McDonald as inventors, and assigned to the current assignee hereof.

BACKGROUND

1. Field

This disclosure relates generally to pressure sensors, and more specifically, to dual port pressure sensors.

2. Related Art

Pressure sensors have become important in a number of applications especially automotive applications. They are typically a combination of a transducer that responds to pressure and an integrated circuit (IC) that interprets that response to provide an electrical signal, analog or digital, that relates to the pressure. In dual port applications, there are two inlets to the transducer, and it is the differential pressure at those two inlets to which the transducer responds. There are a variety of factors such as how the actual combination of the transducer and IC are placed together and the relationship of the mounting to the two inlets. Also the resulting combination will often be mounted on a printed circuit board and how that mounting occurs can be important. For example, it may be important for the printed circuit board to have potting material applied to it. In such a case it is important that neither inlet be covered by the potting material. This may result in both inlets being on the top side of the combination and then creating issues as to how the transducer receives the differential pressure from the two inlets. Also, it is desirable for both the IC and the transducer to be as small as possible to reduce cost.

Accordingly, there is a need for a pressure sensor that improves upon one or more of the issues discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a pressure sensor has a flag and leads in which the flag has a pair of cavities and the leads extend to a bottom side of the pressure sensor for mounting. A first cavity is exposed to a first inlet, which is on a top side of the pressure sensor, on a top side of the flag. A pressure sensor transducer is mounted on the bottom side of the flag and covers the first cavity. A second inlet, which is on the top side of the pressure sensor extends to the second cavity from the top side of the flag. The second cavity is open to bottom side of the flag thus to the pressure sensor transducer so that the transducer is exposed to the first inlet and the second inlet. An integrated circuit is mounted to the bottom side of the flag and is coupled to the pressure sensor transducer. This is better understood by reference to the drawings and the following description.

Figure 1:
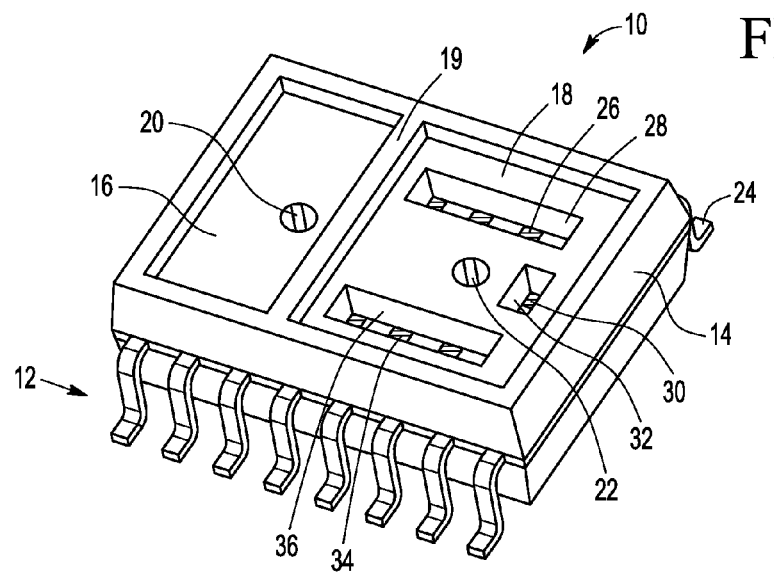
FIG. 1 is an isometric view of a pressure sensor structure showing a top and two sides at a stage in processing according to an embodiment; . . . .

FIG. 1 shows a top and two sides of a pressure sensor structure 10 having a lead frame 12, an encapsulant 14, a cavity 16 in the top, a cavity 18 in the top, a wall 19 between cavities 16 and 18, an opening 20 in cavity 16, and an opening 22 in cavity 18. Lead frame 12 includes a plurality of leads in which lead 24 is shown as a representative lead. Lead frame 12 also includes fingers 26, 30, and 34 at bottoms of cavities 28, 32, and 36, respectively. Cavities 28, 32, and 36 are formed within cavity 18. Encapsulant 14 may be a molded plastic commonly used in packaging integrated circuits.

Figure 2:
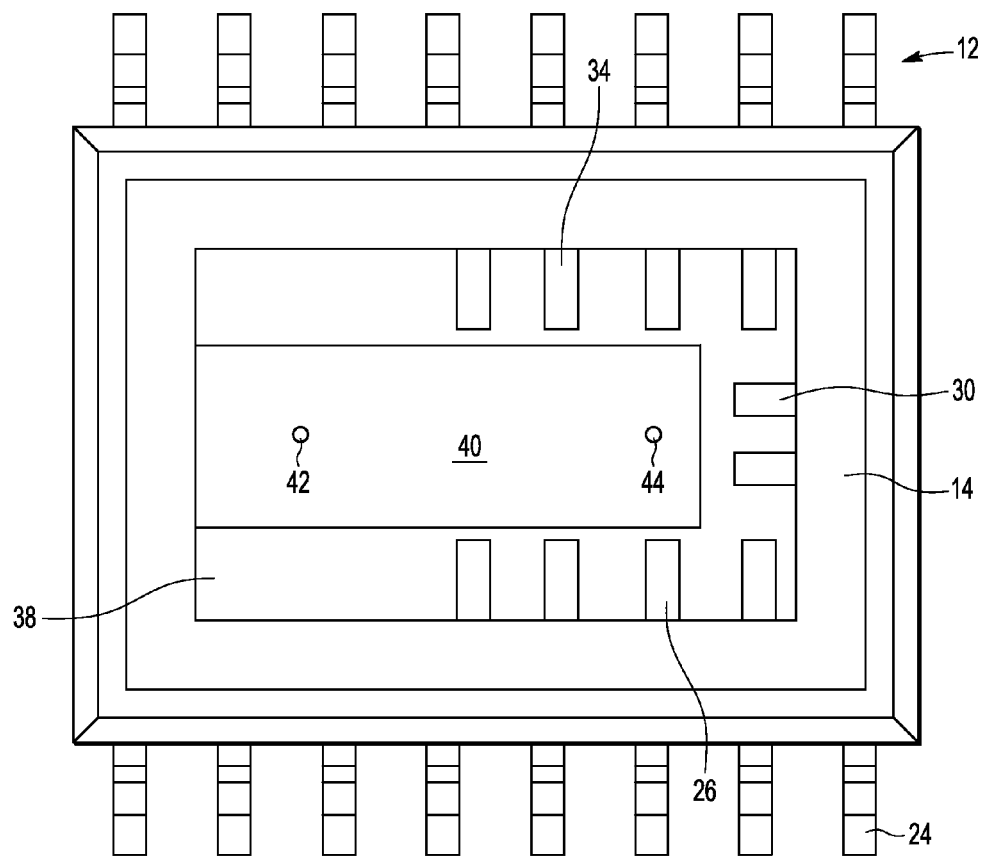
FIG. 2 is a bottom view of the pressure sensor structure of FIG. 1.

Shown in FIG. 2 is a bottom of pressure sensor structure 10 of FIG. 1. Shown in FIG. 2 is a cavity 38 in encapsulant; bottom sides of lead 24, fingers 26, 30, and 34; a flag 40 that is part of lead frame 12, and openings 42 and 44 in flag 40. Lead frame 12 is encapsulated according to a mold around lead frame 12 that results in pressure sensor structure 10 as shown in FIGS. 1 and 2. Encapsulant 14 is molded to expose a portion of flag 40 and portions of the fingers which are represented by fingers 26, 30, and 34. Lead frame 12 is partially covered by encapsulant 14 which is typical of a lead frame that has been encapsulated according to a mold. At least prior to lead frame 12 being part of a structure of a plurality of lead frames, and at the time of encapsulation, the plurality of leads of which lead 24 is an example; fingers 26, 30, and 34; and flag 40 are physically connected together. After encapsulation this connection may be severed with the result shown in FIGS. 1 and 2. A lead frame is considered to be a metallic structure, that at least prior to encapsulation, has leads, fingers, and a flag that are physically connected together and are metallic. At least some of the leads are for forming electrical connection outside of the encapsulant. The flag is for mounting one or more integrated circuits and possibly other devices. The fingers are for connecting to one or more of the devices mounted on the flag. The fingers are for being connected to the leads and to one or more devices on the flag. The fingers may be a continuous part of the leads but shaped for the purpose of connecting to one or more devices on the flag. In this example, the fingers are for being wire bonded. Cavities 28, 32, and 36 in encapsulant 14 shown in FIG. 1 arise from the mold holding lead frame 12 in place during encapsulation. The leads, such as lead 24, are bent down toward the bottom of pressure sensor device 10. The leads do not necessarily have to be dual in-line as shown, but the leads are for mounting to a surface such that the bottom of pressure sensor structure 10 faces the surface. In that sense, the leads are on the bottom of pressure sensor structure 10.

Openings 42 and 44 are made smaller than openings 20 and 22 which is made possible by openings 42 and 44 being made in a metallic structure. Metallic in this case means that a major portion, at least 25 percent, of the structure is a metal. Copper is particularly effective as the metal for lead frames such as lead frame 12. The metal content may even be 100 percent for copper. Opening 20 is aligned to opening 42. Opening 22 is aligned to opening 44. By one method, openings 42 and 44 may be made during the forming of the lead frame and even if subsequently formed would preferably be formed before encapsulation. Openings 20 and 22 may be formed as part of the process of encapsulation as defined by the mold. On the other hand, the encapsulation may be performed before these openings are formed. In such case, encapsulant 14 may be formed and then drilled or etched out to form openings 20 and 22. Openings 42 and 44 may, as an alternative, be drilled after encapsulation. Openings 42 and 44 may also be formed before the encapsulation process even for the case where openings 20 and 22 are not formed by the mold. In such case, encapsulant may need to be removed from openings 42 and 44 or one alternative may be to place removable plugs in openings 42 and 44 prior to encapsulation. Encapsulant materials do not lend themselves to making as small of a diameter of a hole as do metallic materials, at least not in a cost effective manner. In this example, when one opening is described as larger than another opening, it means that the larger opening is wider, which in the case of comparing cylindrical openings, means the larger opening has a greater diameter. Pressure sensor structure 10 thus arises from encapsulating a lead frame in which the flag, flag 40, has openings that may be formed before in the case of the flag, during in the case of the encapsulant, or after in the case of either the flag or the encapsulant. The opening in the flag to which the transducer is attached should be sufficiently small to be covered by the transducer but this requirement does not necessarily apply to the other opening in the flag which may be larger than the opening covered by the transducer.

Figure 3:
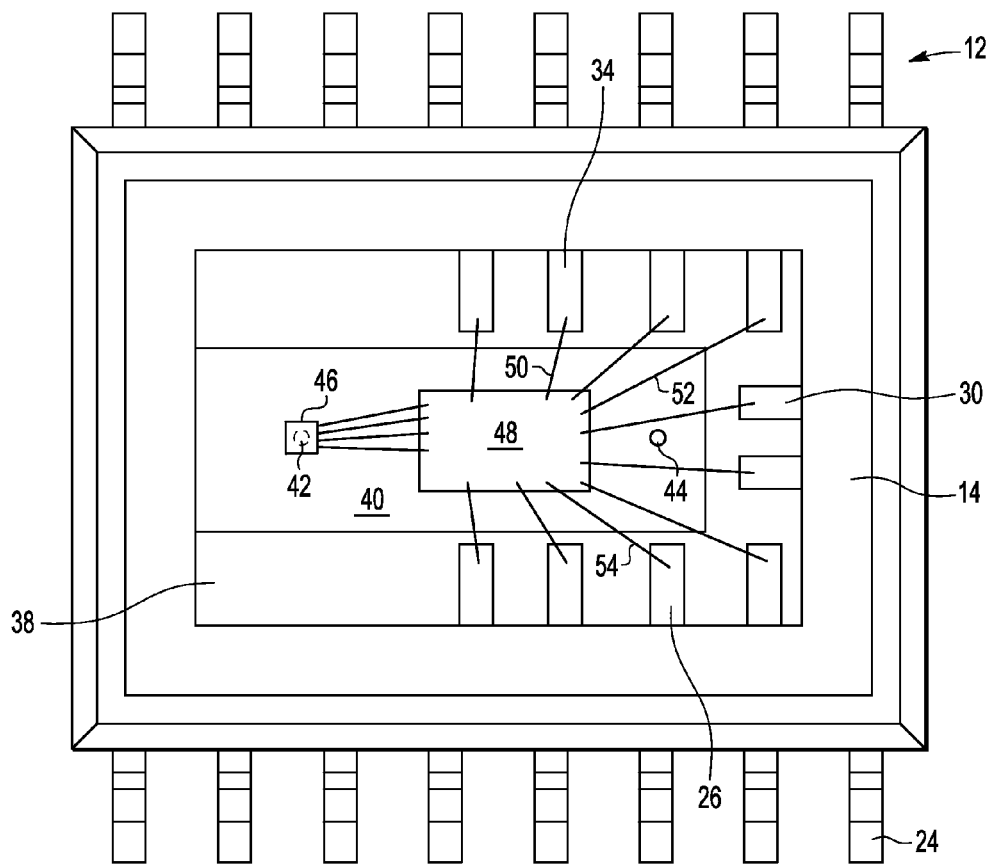
FIG. 3 is a bottom view of pressure sensor structure of FIGS. 1 and 2 at a subsequent stage in processing.

Shown in FIG. 3 is pressure sensor structure 10 after attaching a pressure sensor transducer 46 to flag 40 over opening 42 and an integrated circuit 48 attached to flag 40. Pressure sensor transducer 46 may not be sufficiently large to cover opening 20. The area of pressure sensor transducer 46 may be as much as the cross section of opening 20, but because it has a different shape than the cross section of opening 20, it may not be sufficiently large to cover opening 20. Pressure sensor transducer 46 receives pressure on its bottom and its top and provides a resistance based on the pressure differential between the top and bottom. Thus pressure sensor transducer 46 has one side, which will be referenced as its top side to be consistent with the usage of "top" and "bottom" relative to pressure sensor structure 10, facing opening 42. The top of transducer 46 thus receives one pressure through opening 42. The bottom of transducer 46 receives the other pressure in the more open area in cavity 38 through opening 44. Cavity 38 will be sealed in a subsequent step. Integrated circuit 48 is connected to the fingers, such as fingers 26, 30, and 34, and to transducer 46 by wirebonding. This is a particularly cost effective manner of providing electrical connections. Exemplary wirebonds are wirebonds 50, 52, and 54 connected to fingers 34, 30, and 26, respectively. With the fingers electrically connected to leads, integrated circuit 48 is electrically connected to the leads. Other techniques for electrically connecting transducer 46 to integrated circuit 48 and for electrically connecting integrated circuit 48 to the leads may be used. Integrated circuit 48 processes the resistance information from transducer 46 to provide pressure information, in electrical form, on the leads. An effective way to use the resistance information is by using a bridge. A portion of the bridge may be on transducer 46. Another effective transducer for sensing pressure is one that provides a capacitance in relation to a pressure differential.

Figure 4:
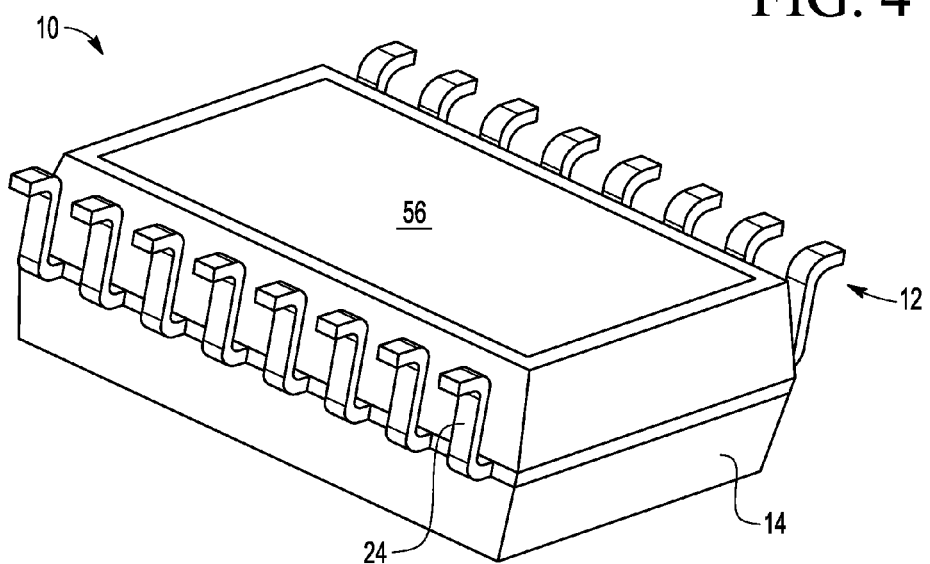
FIG. 4 is a bottom view of the pressure sensor structure of FIG. 3 at a subsequent stage in processing.

Shown in FIG. 4 is pressure sensor structure 10 after a lid 56 has been placed on the bottom of pressure sensor structure 10. Lid 56 is sealed so that the pressure of cavity 38 is established through opening 44. Lid 56 results in an enclosure where one of the two pressures will be applied to transducer 46. With transducer 46 in a cavity, it is convenient to from the enclosure simply by applying a flat lid over the cavity. A possible alternative may be for transducer 46 and integrated circuit 48 to not be in a cavity, lid 56 to be shaped so as to seal an enclosure around transducer 46, integrated circuit 48, and opening 42. The use of cavity 38 currently has benefits in that it is convenient to form with currently used encapsulant material which also holds the flag, leads, and fingers in place.

Figure 5:
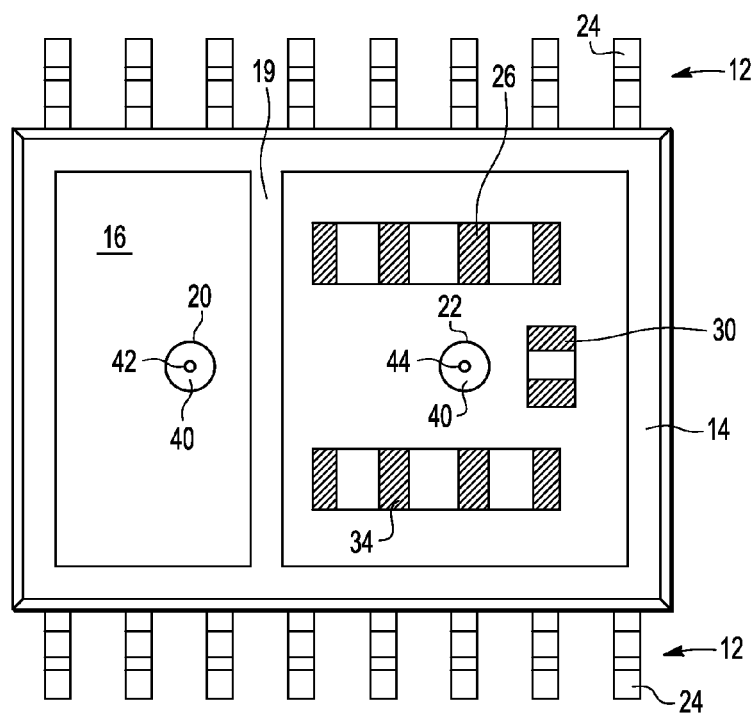
FIG. 5 is a top view of the pressure sensor structure of FIGS. 1 and 2.

Shown in FIG. 5 is pressure sensor structure 10 from a top view which is the same as that shown in FIG. 2 except that more detail is available from a direct top view such as portions of flag 40 through openings 20 and 22 are visible as are openings 42 and 44 in flag 40. Also more of the fingers are visible. This is prior to attaching transducer 46.

Figure 6:
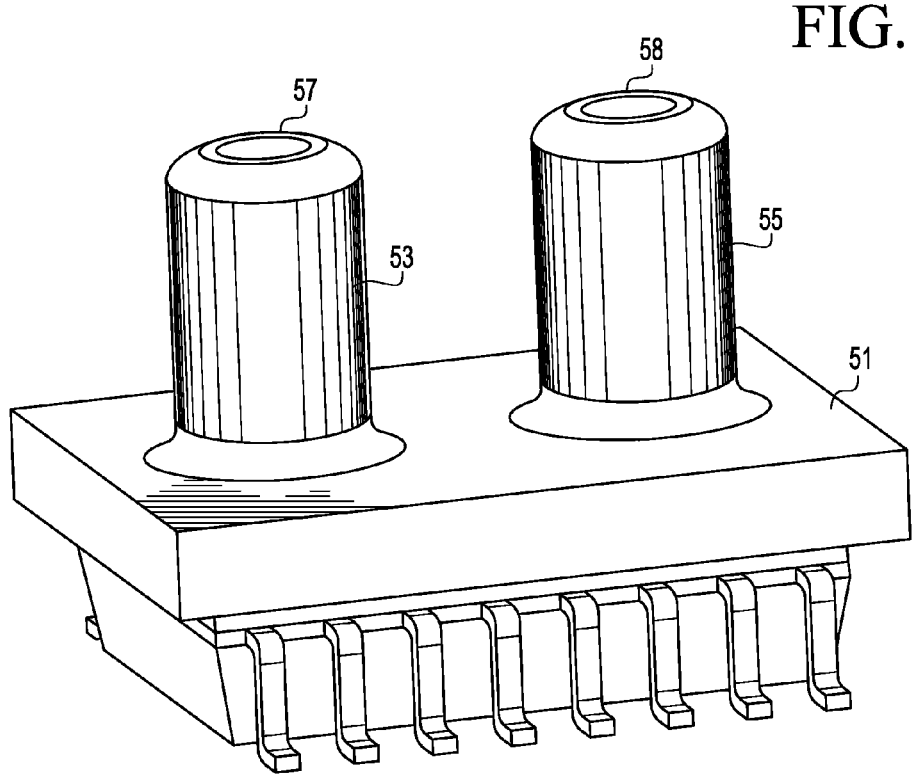
FIG. 6 is an isometric view of the pressure sensor structure as a completed pressure sensor showing a top and two sides.

Shown in FIG. 6 is pressure sensor structure 10 after attaching a dual port 51 to pressure sensor structure 10 as shown in FIG. 5. This may be performed before or after transducer 46 and integrated circuit 48 have been attached and before or after lid 56 has been attached. Dual port 51 has a port 53 with an opening 57 that extends to cavity 18 and a port 55 that has an opening 58 that extends to cavity 16. Dual port 51 is sealed using barrier 19 to ensure that opening 57 and openings 58 are kept separate and the only access to cavity 16 through dual port 51 is through the top of opening 58 and the only access to cavity 18 through dual port 51 is through the top of opening 57. Cavities make it convenient for providing a seal for dual port 51, but an alternative may be to not form cavities 16 and 18 but simply rely on dual port 51 sealing to a flat surface on the top of the encapsulant to prevent the pressure differential applied to openings 57 and 58 from being compromised.

Figure 7:
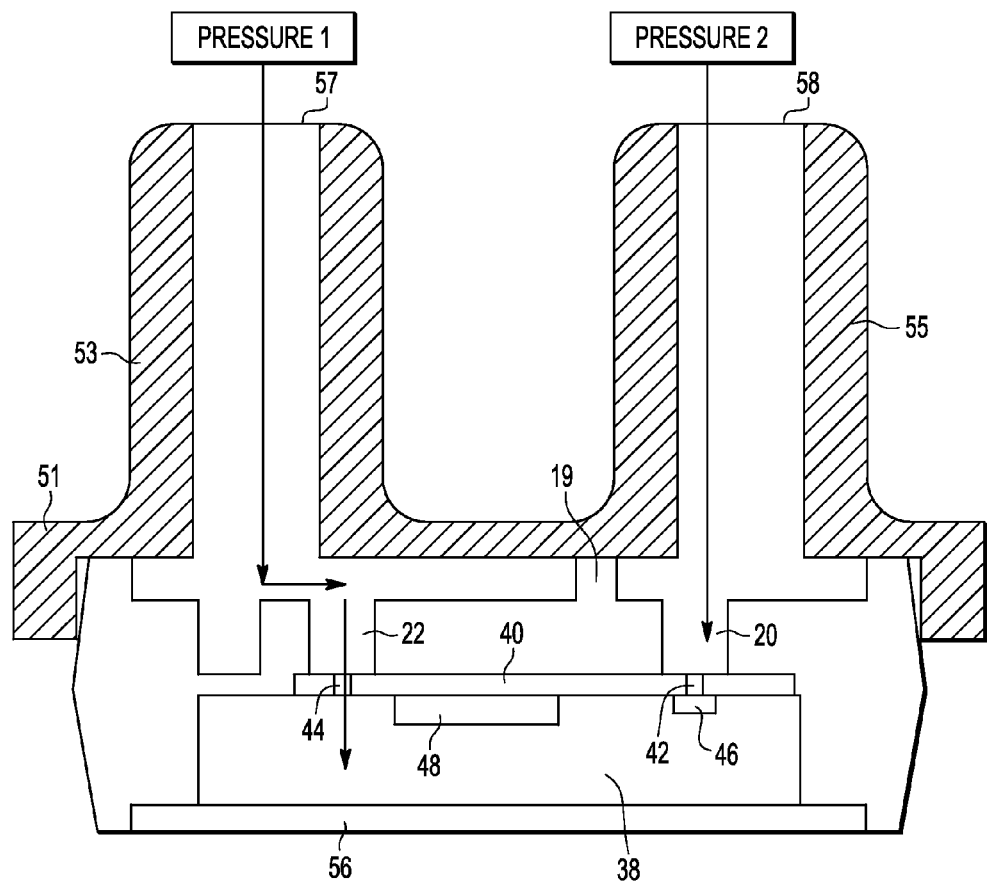
FIG. 7 is a cross section of the pressure sensor structure of FIG. 6.

Shown in FIG. 7 is a cross section of pressure sensor structure 10 as a completed dual port pressure sensor. This shows dual port 51 sealed to tops of sidewalls, including barrier 19, that define cavities 16 and 18. Also shown is the path of pressure from opening 57 to cavity to 18, to opening 22, to opening 44, to cavity 38, and thus to the bottom side of transducer 46. Similarly, a pressure path from opening 58 to cavity 16, to opening 20, to opening 42, and thus to the top side of transducer 46, is shown. Dual port 51 is shown as a unitary structure, but it may be achieved using multiple structures. For example, a different unit could be used for each port so that different structures would be used for connecting to cavities 16 and 18 but the group of multiple structures that achieve the dual port function could still be referenced as a dual port. In either case, one port is sealed to one cavity and the other port is sealed to the other cavity so that a pressure differential can be sustained between the two cavities.

The result is an efficient use of packaging technology that includes using openings in a flag to achieve a dual port pressure sensor in which both ports are on the top side of the dual port pressure sensor.

By now it should be appreciated that there has been provided a method of making a dual port sensor. The method includes molding an encapsulant around a lead frame including a flag, leads, and fingers, to have a bottom cavity on a bottom side of the encapsulant exposing a bottom surface of the flag and bottom portions of the fingers; a first top cavity on a top side of the encapsulant; a first opening in the encapsulant within the first top cavity; a second top cavity on the top side of the encapsulant; and a second opening in the encapsulant within the second top cavity. The method further includes forming a first opening through the flag that is smaller than the first opening in the encapsulant. The method further includes forming a second opening through the flag. The method further includes attaching a dual port on the top side of the dual port pressure sensor to couple a first port of the dual port to the first top cavity and a second port of the dual port to the second top cavity. The method further includes attaching a pressure sensor transducer to the bottom surface of the flag and covering the first opening in the flag. The method further includes attaching an integrated circuit to the bottom surface of the flag, spaced from the second opening in the flag. The method further includes electrically coupling the fingers and the pressure sensor transducer to the integrated circuit. The method further includes attaching a cap to the bottom cavity on the bottom side of the dual port pressure sensor. The method includes a further characterization by which the first opening through the flag is aligned to the first opening in the encapsulant. The method includes a further characterization by which the second opening through the flag is aligned to the second opening in the encapsulant. The method may include a further characterization by which the leads extend laterally externally from the encapsulant, further comprising bending leads downward toward the bottom side of the encapsulant. The method may include a further characterization by which the steps of forming the first opening through the flag and the forming the second opening through the flag occur before the step of molding. The method may include a further characterization by which the step of attaching the dual port is further characterized by the dual port comprising a unitary body attached after the step of attaching the cap. The method may include a further characterization by which the step of attaching the dual port comprises attaching a first port to the encapsulant over the first top cavity and attaching a second port to the encapsulant over the second top cavity. The method may include a further characterization by which the step of electrically coupling comprises wirebonding. The method may include a further characterization by which the step of electrically coupling is further characterized as enabling the pressure sensor transducer to provide electrically recognizable information that correlates to a pressure differential applied to a top and a bottom of the pressure sensor transducer to the integrated circuit. The method may include a further characterization by which the step of electrically coupling is further characterized by the electrically recognizable information relating to resistance. The method may include a further characterization by which the step of attaching a lid provides an enclosure for a pressure to be applied to a bottom side of the pressure sensor transducer received through the second opening in the flag. The method may include a further characterization by which the step of attaching the pressure sensor transducer is further characterized by the pressure sensor transducer not being sufficiently large to cover the first opening within the first top cavity.

Also described is a method of forming a dual port pressure sensor including forming a first opening and a second opening in a flag of a lead frame, wherein the lead frame further comprises leads connected to fingers. The method further includes molding an encapsulant over the lead frame, wherein the leads extend laterally out from the encapsulant; the encapsulant has a first cavity with a first opening aligned to the first opening in the flag, wherein the first cavity is on a top side of the encapsulant; and the encapsulant has a second cavity with a second opening aligned to the second opening in the flag, wherein the second cavity is on the top side of the encapsulant. The method further includes attaching a pressure sensor transducer to a bottom of the flag and covering the first opening in the flag. The method further includes attaching an integrated circuit to the bottom of the flag, spaced from the second opening in the flag, and electrically connected to the pressure sensor transducer and the fingers. The method may have a further characterization by which the step of molding the encapsulant is further characterized by forming a third cavity on a bottom of the encapsulant in which the bottom of the flag is along a surface of the third cavity, further comprising attaching a lid to the third cavity to form an enclosure with the third cavity. The method may have a further characterization by which the step of forming the first opening in the flag is further characterized by the first opening in the flag being smaller than the first opening in the encapsulant and wherein the step of molding is further characterized by the first opening in the encapsulant being too large to be covered by the pressure sensor transducer. The method may further comprise attaching dual port to a top of the encapsulant, wherein the dual port has a first port sealed to the first cavity and a second port sealed to the second cavity so that a pressure differential can be sustained between the first cavity and the second cavity. The method may have a further characterization by which, if a differential in pressure between the first port and the second port is established by applying a first pressure to the first port and a second pressure to the second port, the differential is coupled to the pressure sensor transducer by the first pressure being through the first cavity, through the first opening in the first cavity, and through the first opening in the flag to a top side of the pressure sensor transducer, and the second pressure being through the second cavity, through the second opening in the second cavity, through the second opening in the flag, through the third cavity to a bottom side of the pressure sensor transducer.

Described also is a method of making a dual port pressure sensor including forming a first opening and a second opening in a flag of a lead frame. The method also includes molding an encapsulant to hold the lead frame in which the encapsulant is over a top of the flag and a bottom of the flag is uncovered by the encapsulant, wherein a first opening in the encapsulant is aligned with and larger than the first opening in the flag and a second opening in the encapsulant aligned with the second opening in the flag. The method also includes attaching a pressure sensor transducer to the bottom of the flag to cover the first opening in the flag, wherein the pressure sensor transducer provides an electrically detectable correlation to a pressure differential based on a first pressure received on its top side and a second pressure received on its bottom side. The method also includes attaching an integrated circuit to the bottom of the flag. The method also includes electrically coupling the integrated circuit to the pressure sensor transducer. The method also includes attaching a lid to the encapsulant to form an enclosure around the bottom of the flag. The method includes a characterization by which the pressure sensor transducer receives the first pressure through the first opening in the encapsulant and the first opening in the flag and the second pressure through the second opening in the encapsulant, the second opening in the flag, and the enclosure. The method may have a further characterization by which the step of molding forms a first cavity around the first opening in the encapsulant and a second cavity around the second opening in the encapsulant. The method may further comprise attaching a dual port to the encapsulant wherein the dual port has a first opening over the first opening in the encapsulant and a second opening over the second opening of the encapsulant and is sealed to the encapsulant to keep the first pressure and the second pressure separate. The method may have a further characterization by which the step of molding further comprises forming a bottom cavity wherein flag is within a bottom cavity and wherein the step of attaching the lid is further characterized as the lid covering the bottom cavity to form the enclosure. The method may have a further characterization by which the step of molding is further characterized by the first opening being formed within a first top cavity, the second opening being formed within a second top cavity, and the first and second top cavities sharing a common wall that functions as a barrier to keep the first and second pressures separate.

Although the invention is described herein with reference to specific embodiments, various modifications and changes can be made without departing from the scope of the present invention as set forth in the claims below. For example, the combination of an integrated circuit and transducer have been explained solely for use as a pressure sensor so that the integrated circuit is application specific (an ASIC), but the finished packaged device may be more than just a pressure sensor such as an engine controller and have far more leads than that shown. In such case the pressure information may be used by the integrated circuit and not be required to be supplied externally to the packaged device. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a dual port pressure sensor, comprising:
    molding an encapsulant around a lead frame including a flag, leads, and fingers, to have:
        a bottom cavity on a bottom side of the encapsulant exposing a bottom surface of the flag and bottom portions of the fingers;
        a first top cavity on a top side of the encapsulant;
        a first opening in the encapsulant within the first top cavity;
        a second top cavity on the top side of the encapsulant; and
        a second opening in the encapsulant within the second top cavity;
    forming a first opening through the flag that is smaller than the first opening in the encapsulant;
    forming a second opening through the flag;
    attaching a dual port on the top side of the dual port pressure sensor to couple a first port of the dual port to the first top cavity and a second port of the dual port to the second top cavity;
    attaching a pressure sensor transducer to the bottom surface of the flag and covering the first opening in the flag;
    attaching an integrated circuit to the bottom surface of the flag, spaced from the second opening in the flag,
    electrically coupling the fingers and the pressure sensor transducer to the integrated circuit; and
    attaching a cap to the bottom cavity on the bottom side of the dual port pressure sensor;
    wherein the first opening through the flag is aligned to the first opening in the encapsulant; and
    wherein the second opening through the flag is aligned to the second opening in the encapsulant.

2. The method of claim 1 wherein the leads extend laterally externally from the encapsulant, further comprising bending leads downward toward the bottom side of the encapsulant.

3. The method of claim 1 wherein the steps of forming the first opening through the flag and the forming the second opening through the flag occur before the step of molding.

4. The method of claim 1, wherein the step of attaching the dual port is further characterized by the dual port comprising a unitary body attached after the step of attaching the cap.

5. The method of claim 1, wherein the step of attaching the dual port comprises attaching a first port to the encapsulant over the first top cavity and attaching a second port to the encapsulant over the second top cavity.

6. The method of claim 1, wherein the step of electrically coupling comprises wirebonding.

7. The method of claim 6, wherein the step of electrically coupling is further characterized as enabling the pressure sensor transducer to provide electrically recognizable information that correlates to a pressure differential applied to a top and a bottom of the pressure sensor transducer to the integrated circuit.

8. The method of claim 7, wherein the step of electrically coupling is further characterized by the electrically recognizable information relating to resistance.

9. The method of claim 1, wherein the step of attaching a lid provides an enclosure for a pressure to be applied to a bottom side of the pressure sensor transducer received through the second opening in the flag.

10. The method of claim 1, wherein the step of attaching the pressure sensor transducer is further characterized by the pressure sensor transducer not being sufficiently large to cover the first opening within the first top cavity.

11. A method of forming a dual port pressure sensor, comprising:
    forming a first opening and a second opening in a flag of a lead frame, wherein the lead frame further comprises leads connected to fingers;
    molding an encapsulant over the lead frame, wherein:
        the leads extend laterally out from the encapsulant;
        the encapsulant has a first cavity with a first opening aligned to the first opening in the flag, wherein the first cavity is on a top side of the encapsulant;
        the encapsulant has a second cavity with a second opening aligned to the second opening in the flag, wherein the second cavity is on the top side of the encapsulant;
    attaching a pressure sensor transducer to a bottom of the flag and covering the first opening in the flag;
    attaching an integrated circuit to the bottom of the flag, spaced from the second opening in the flag, and electrically connected to the pressure sensor transducer and the fingers.

12. The method of claim 11, wherein the step of molding the encapsulant is further characterized by forming a third cavity on a bottom of the encapsulant in which the bottom of the flag is along a surface of the third cavity, further comprising attaching a lid to the third cavity to form an enclosure with the third cavity.

13. The method of claim 12, wherein the step of forming the first opening in the flag is further characterized by the first opening in the flag being smaller than the first opening in the encapsulant and wherein the step of molding is further characterized by the first opening in the encapsulant being too large to be covered by the pressure sensor transducer.

14. The method of claim 13, further comprising attaching dual port to a top of the encapsulant, wherein the dual port has a first port sealed to the first cavity and a second port sealed to the second cavity so that a pressure differential can be sustained between the first cavity and the second cavity.

15. The method of claim 14, whereby the steps of claim 13 provide that if a differential in pressure between the first port and the second port is established by applying a first pressure to the first port and a second pressure to the second port, the differential is coupled to the pressure sensor transducer by the first pressure being through the first cavity, through the first opening in the first cavity, and through the first opening in the flag to a top side of the pressure sensor transducer, and the second pressure being through the second cavity, through the second opening in the second cavity, through the second opening in the flag, through the third cavity to a bottom side of the pressure sensor transducer.

16. A method of forming a dual port pressure sensor, comprising:
   forming a first opening and a second opening in a flag of a lead frame;
   molding an encapsulant to hold the lead frame in which the encapsulant is over a top of the flag and a bottom of the flag is uncovered by the encapsulant, wherein a first opening in the encapsulant is aligned with and larger than the first opening in the flag and a second opening in the encapsulant aligned with the second opening in the flag;
   attaching a pressure sensor transducer to the bottom of the flag to cover the first opening in the flag, wherein the pressure sensor transducer provides an electrically detectable correlation to a pressure differential based on a first pressure received on its top side and a second pressure received on its bottom side;
   attaching an integrated circuit to the bottom of the flag;
   electrically coupling the integrated circuit to the pressure sensor transducer; and
   attaching a lid to the encapsulant to form an enclosure around the bottom of the flag;
   whereby the pressure sensor transducer receives the first pressure through the first opening in the encapsulant and the first opening in the flag and the second pressure through the second opening in the encapsulant, the second opening in the flag, and the enclosure.

17. The method of claim 16, wherein the step of molding forms a first cavity around the first opening in the encapsulant and a second cavity around the second opening in the encapsulant.

18. The method of claim 16, further comprising attaching a dual port to the encapsulant wherein the dual port has a first opening over the first opening in the encapsulant and a second opening over the second opening of the encapsulant and is sealed to the encapsulant to keep the first pressure and the second pressure separate.

19. The dual method of claim 18, wherein the step of molding further comprises forming a bottom cavity wherein flag is within a bottom cavity and wherein the step of attaching the lid is further characterized as the lid covering the bottom cavity to form the enclosure.

20. The method of claim 19, wherein the step of molding is further characterized by the first opening being formed within a first top cavity, the second opening being formed within a second top cavity, and the first and second top cavities sharing a common wall that functions as a barrier to keep the first and second pressures separate.

* * * * *